United States Patent
Bae

[11] Patent Number: 5,969,702
[45] Date of Patent: Oct. 19, 1999

[54] LIQUID CRYSTAL PANEL WITH A PLURALITY OF LIGHT SHIELDING PORTIONS OVER A SUBSTRATE INCLUDING A PIXEL REGION AND A DRIVER CIRCUIT REGION

[75] Inventor: Sung-Sik Bae, Seoul, Rep. of Korea

[73] Assignee: LG Electronics Inc., Seoul, Rep. of Korea

[21] Appl. No.: 08/833,496

[22] Filed: Apr. 7, 1997

[30] Foreign Application Priority Data

May 11, 1996 [KR] Rep. of Korea ............... 96/15698

[51] Int. Cl.⁶ ............... G09G 3/36; G02F 1/1333
[52] U.S. Cl. ............................... 345/92; 349/110
[58] Field of Search ................ 345/92, 205, 206; 349/42, 43, 44, 45, 46, 47, 110, 111, 137, 138; 430/20; 438/30; 505/413; 257/59

[56] References Cited

U.S. PATENT DOCUMENTS

| | | | |
|---|---|---|---|
| 5,317,433 | 5/1994 | Miyawaki et al. | 349/45 |
| 5,346,833 | 9/1994 | Wu | 438/30 |
| 5,419,991 | 5/1995 | Segawa | 430/20 |
| 5,432,625 | 7/1995 | Morin et al. | 349/42 |
| 5,541,748 | 7/1996 | Ono et al. | 349/42 |
| 5,666,177 | 9/1997 | Hsieh et al. | 349/111 |
| 5,703,668 | 12/1997 | Shin | 349/110 |
| 5,712,494 | 1/1998 | Akiyama et al. | 257/59 |
| 5,718,992 | 2/1998 | Sato et al. | 349/110 |
| 5,781,254 | 7/1998 | Kim et al. | 349/44 |
| 5,784,133 | 7/1998 | Kim et al. | 349/44 |
| 5,814,529 | 9/1998 | Zhang | 438/30 |
| 5,844,255 | 12/1998 | Suzuki et al. | 257/59 |

*Primary Examiner*—Jeffery Brier
*Assistant Examiner*—Paul A. Bell
*Attorney, Agent, or Firm*—Finnegan, Henderson, Farabow, Garrett & Dunner, L.L.P.

[57] ABSTRACT

A method of fabricating a liquid crystal panel comprises the steps of forming a black matrix on a substrate, forming a buffer layer on the substrate, forming semiconductors layer on the buffer layer, doping n⁺ impurities into a semiconductor layer on a pixel region on the substrate and in one semiconductor layer of the driver circuit region forming a gate insulating layer on the buffer layer and the semiconductor layer, forming a gate electrode on the gate electrode, introducing n⁻ impurities into the semiconductor layer using the gate electrode as a mask after patterning of the gate insulating layer, doping p⁺ impurities into another semiconductor layer of the driver circuit unit, forming an insulating layer having a contact hole over the pixel region, forming a transparent electrode on the pixel region and into the contact hole.

9 Claims, 6 Drawing Sheets

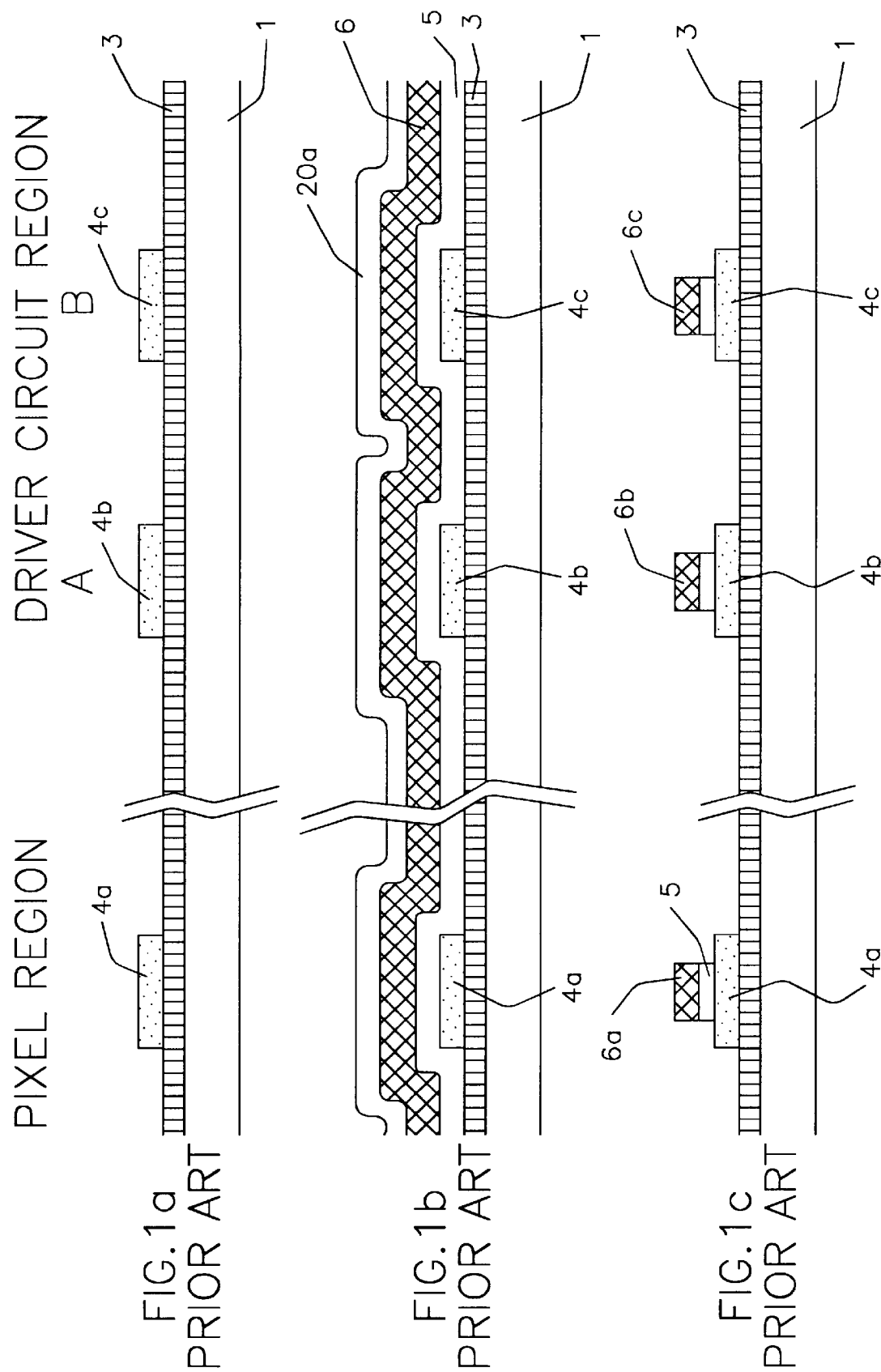

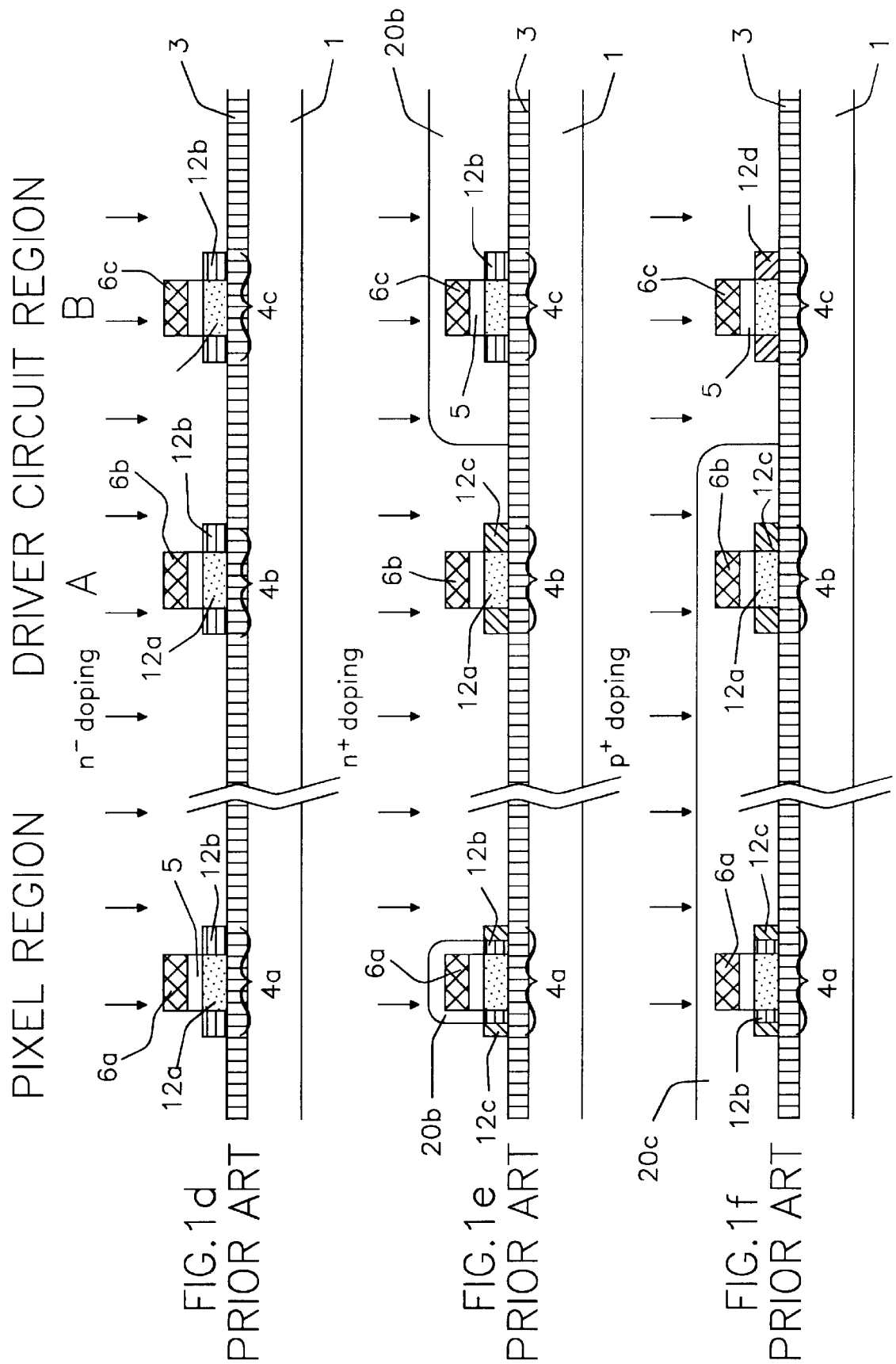

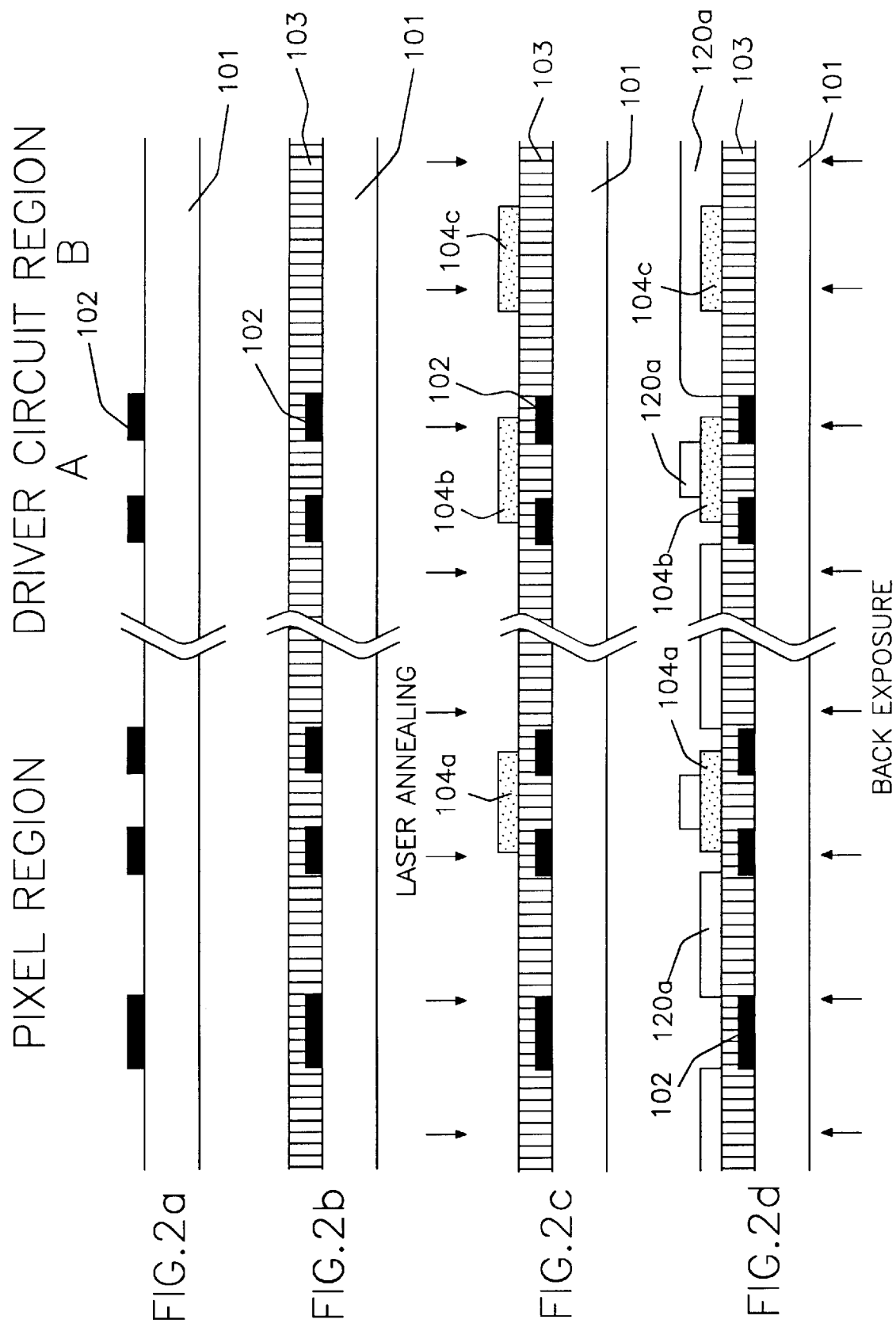

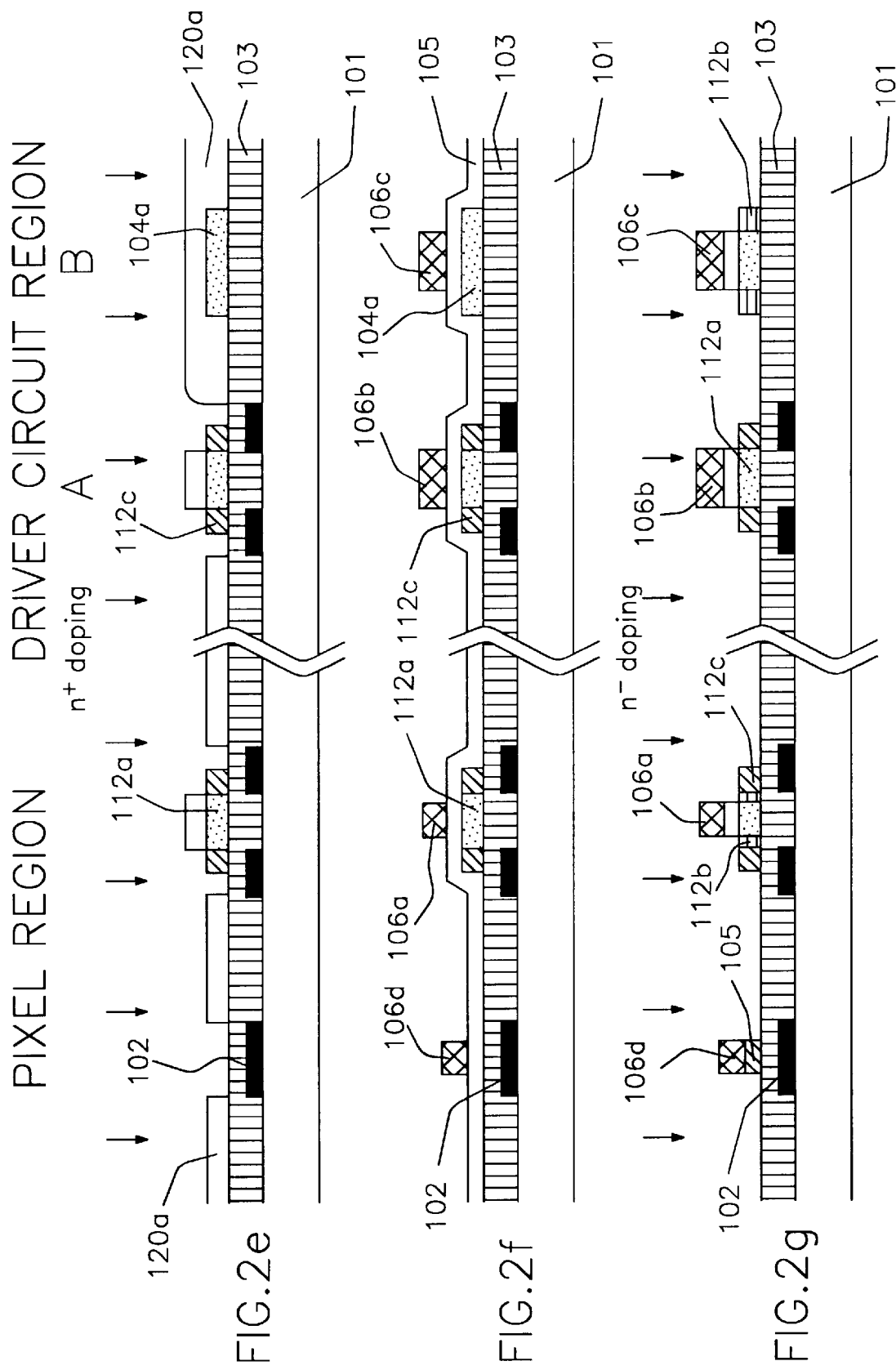

LIQUID CRYSTAL PANEL WITH A PLURALITY OF LIGHT SHIELDING PORTIONS OVER A SUBSTRATE INCLUDING A PIXEL REGION AND A DRIVER CIRCUIT REGION

BACKGROUND OF THE INVENTION

The present invention relates to a liquid crystal panel and related method, and more particularly to a liquid crystal panel in which a thin film pixel driving transistors and thin film driver circuit transistors are integrated on a panel in a single process.

Large area and high resolution active matrix liquid crystal displays (AMLCD) include thin film transistors (TFTs) for driving individual pixels of the display pixels. TFTs are also incorporated into driver circuits for applying signals to gate bus lines and data bus lines coupled to the pixel driving TFTs of the display.

Generally, the driver circuit unit can be an integrated circuit attached to an outer portion of the substrate of the liquid crystal panel, and the driver circuit TFTs formed on the liquid crystal panel. Typically, the complementary metal oxide semiconductor TFTs (CMOS TFTs) with high field effect mobility are used in the driver circuits attached to the liquid crystal panel. Since this type of CMOS TFT consists of polysilicon (p-Si), the switching speed is much higher than that of amorphous silicon (a-Si). Further, because the driver circuit TFT and the pixel driving TFT are fabricated at the same time, the fabrication cost can be decreased.

FIGS. 1a–1h illustrate various steps of the conventional method of fabricating a typical liquid crystal panel including TFT driver circuits. For illustrative purposes in FIGS. 1a–1h, the driver circuit unit is shown divided into parts A and B.

As shown in FIG. 1a, a buffer layer 3 is first formed on the substrate 1 and then patterned a-Si semiconductor layers 4a, 4b and 4c are formed on the pixel and driver circuit portions. Semiconductor layer 4a corresponds to a transistor driving a single pixel and semiconductor layers 4b and 4c represent NMOS and PMOS TFTs formed on the driver circuit region.

As shown in FIG. 1b, an insulating layer 5 such as $SiO_2$ and SiNx, a metal layer 6 such as Al, Al alloy, and Cr, and a photoresist 20a are successively formed on buffer layer 3. The insulating layer 5 and the metal layer 6 are patterned by a photolithography process to form gate insulating layer 5 and gate electrodes 6a, 6b, 6c. Low concentration $n^-$ ions are introduced into the entire area of the substrate 1, as shown in FIG. 1d, using gate electrodes 6a, 6b, 6c as masks over semiconductor layers 4a, 4b, 4c. As a result, portions of semiconductor layers 4a, 4b, 4c except those regions covered by gate electrodes 4a, 4b, 4c become doped $n^-$ layers 12b, and the regions under gate electrodes 4a, 4b, 4c become channel layers 12a.

Thereafter, photoresist layer 20b is deposited over substrate 1 and patterned to shield part B of the driver circuit region; gate electrode 6a, part of the activation layer, and an $n^-$ layer of the pixel region. As shown in FIG. 1e, $n^+$ ions are introduced into the entire surface of substrate 1. In the pixel region, the width of photoresist 20b is larger than that of the gate electrode. Accordingly, the $n^+$ ions are implanted into a part of the $n^-$ layer 12b. As a result, $n^+$ layer 12c is formed in semiconductor layers 4a and 4b of the pixel region and part A of the driver circuit region. Further, the resulting transistor in the pixel region has an LDD structure including $n^+$ layer 12c and $n^-$ layer 12b.

After photoresist 20b is removed, another photoresist layer 20c is deposited and patterned to shield the pixel region and part A of the driver circuit, as shown in FIG. 1f. $P^+$ ions are then implanted into substrate 1, and $p^+$ region 12d are thus formed in part B of the driver circuit. Regions 12d are doped with both $p^+$ and $n^-$ ions, and are thus counter doped. Since the $n^-$ ion concentration is approximately $10^{17} \sim 10^{18}/cm^3$ and the $p^+$ doping is about $10^{19} \sim 10^{21}/cm^3$, the $n^-$ layer 12b is converted into $p^+$ layer 12d. Photoresist layer 20c is then removed.

Thus, the pixel region has TFTs with an LDD structure, including $n^+$ layer 12a and $n^-$ layer 12b, and the driver circuit has NMOS TFTs having $n^+$ layer 12c and PMOS TFTs including $p^+$ layers 12d.

A contact hole is next formed in patterned SiNx insulation layer 7, as shown in FIG. 1g. A metal, such as Al, is then deposited on insulating layer 7 and into the contact hole to form source/drain electrode 8. Further, indium tin oxide (ITO) is deposited on the insulating layer 7 and source/drain electrode 8 to form a transparent pixel electrode 9 as shown in FIG. 1h. A passivation layer 10 is then provided blanketing the entire surface. In the liquid crystal panel fabricated according to the above described process, the pixel region has TFTs with an LDD structure and the driver circuit unit includes CMOS TFTs.

Although not shown in the figures, passivation layer 10 is patterned to form pad openings to interconnect the driver circuit region with an outer driver circuit attached to an outer portion of the substrate of the liquid crystal panel. Further, an alignment layer is formed on the passivation layer and rubbed mechanically to provide an alignment direction for the liquid crystal material. Further, another substrate is provided facing the above-described substrate, having color filters and a black matrix formed thereon to prevent light leakage.

In the above mentioned process, ten masks are used for patterning: the semiconductor layer, the $n^+$ implant mask, the gate insulating layer and gate electrodes, the $p^+$ implant mask, the contact hole, the source/drain electrodes, the transparent electrode, passivation layer pad openings, and black matrix. The conventional process, therefore, is complicated, the yield is reduced, and the fabrication cost is increased.

SUMMARY OF THE INVENTION

An object of the present invention is to provide a liquid crystal panel having a thin film transistor driver circuit and a related manufacturing method in which the black matrix, pixel unit, and a driver circuit unit are fabricated on one panel, so that the fabrication cost can be decreased and the aperture ratio can be improved.

In order to achieve this object, the present invention provides a method comprising the steps of forming the black matrix on a substrate, forming a buffer layer over the substrate, forming semiconductor layers on the buffer layer, doping $n^+$ ions into the semiconductor layers using a patterned photoresist layer to mask one of the semiconductor layers and a portion of one of the other semiconductor layers of the driver circuit region, and a portion of the semiconductor layer of the pixel region, thus selectively forming $n^+$ layers in the semiconductor layer of the pixel region and in the driver circuit region.

The method further comprises the steps of: forming a patterned gate insulating layer on the buffer layer and the semiconductor layer, forming a gate electrode on the gate insulating layer, introducing $n^-$ ions into the semiconductor layer using the gate electrode as a mask, introducing p+ ions into the semiconductor layer using a photoresist layer as a mask covering the pixel region and selected ones of the layers of the driver circuit region implanted with n+ ions to form the p+ layer in other semiconductor layers of the driver circuit, forming an insulating layer having a contact hole, forming a transparent electrode on the insulating layer of the pixel region and into the contact hole.

Since the width of the gate electrode in the pixel region is narrower than that of the gate electrode in the driver circuit region, the n− layer is formed between the n+ layer and the channel region of the semiconductor layer of the pixel region. Accordingly, the pixel region includes thin film transistors having lightly doped drain structures comprising an n+ layer, an n− layer, and the channel region.

The semiconductor layers are typically made of polysilicon formed by laser annealing of amorphous silicon.

The fabrication process in accordance with the present invention requires only six masks for: patterning the black matrix, patterning the semiconductor layer, patterning photoresist layer masks for doping the p+ ions, forming the contact hole, and forming the transparent electrode.

BRIEF DESCRIPTION OF THE DRAWINGS

FIGS. 1a–1h illustrate the steps of a conventional method for fabricating a typical liquid crystal panel.

FIGS. 2a–2j illustrate a process according to the present invention for forming pixel driving TFT portions (i.e., the pixel region) and driver circuit CMOS TFT portions (i.e., the driver circuit region) formed on substrate 101. Further, the driver circuit region is divided into parts A and B corresponding to NMOS TFT and PMOS TFT regions, respectively.

As seen in FIG. 2a, a substantially opaque layer preferably including black resin is formed on substrate 101 by depositing black resin or the like on the surface of substrate 101. The layer is then patterned to form black matrix 102, which prevent light leakage outside the pixel areas. Black matrix 102 is preferably formed in regions corresponding to the TFT, gate bus line, and data bus line. Preferably, black matrix 102 overlaps an edge of the pixel.

As shown in FIG. 2b, a buffer layer 103 preferably including SiO₂ is formed on substrate 101 and black matrix 102, and as shown in FIG. 2c, an a-Si layer is formed on buffer layer 103, which is annealed through a single exposure to laser light emitted from an eximer laser. As a result, the a-Si is crystallized and converted into the polysilicon (p-Si). The p-Si layer is then patterned to form spaced p-Si semiconductor layers 104a, 104b, 104c on buffer layer 103, as shown in FIG. 2c.

Figure 1G:
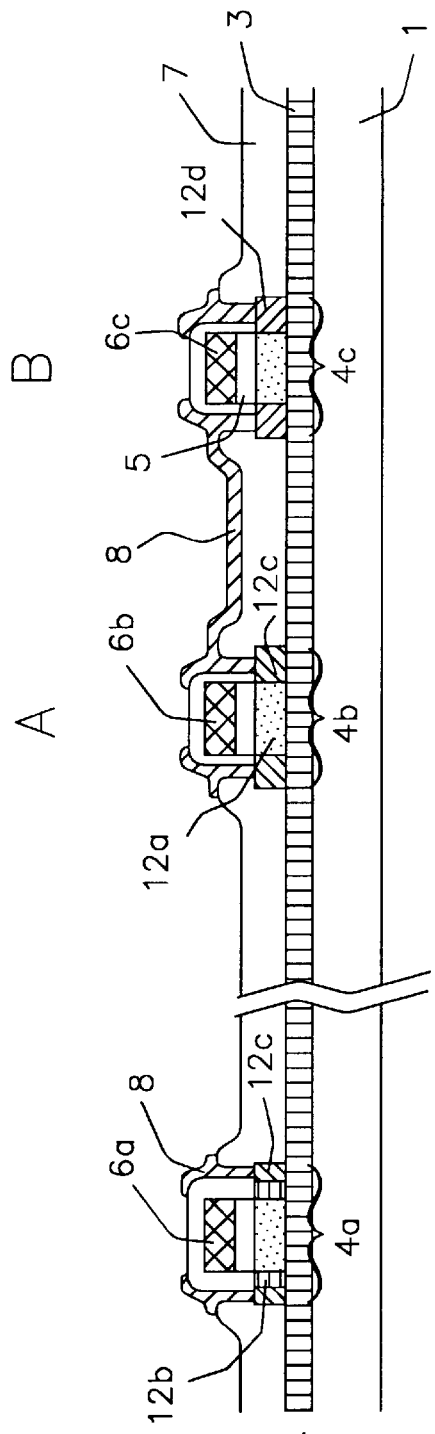
Figure 1H:
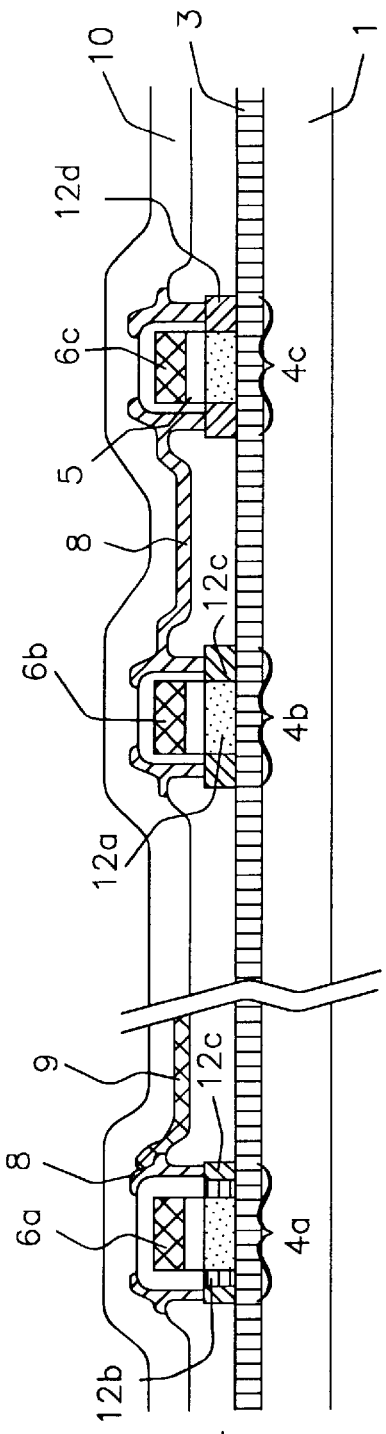

Semiconductor layer 104a, which will form part of a pixel driving TFT, is formed in the pixel region unit, and semiconductor layers 104b and 104c will form part of the CMOS TFTs of parts A and B of the driver circuit region. Typically, the p-Si layer can be formed at low temperatures (at below about 550° C.) and then patterned, as described above.

Photoresist 120a is next deposited on the buffer layer 103 and semiconductor layers 104a, 104b and 104c and then patterned through back exposure, as shown in FIG. 2d. Photoresist 120a is typically a negative photoresist. Thus, only portions of photoresist 120 shielded from the back exposure light by the black matrix 102 are removed during a subsequent development step. Accordingly, no additional masks are required to pattern photoresist 120a. Thus, black matrix 102 serves a dual purpose: preventing leakage of light through area outside the pixels, and patterning photoresist 120a. Further, since the black matrix 102 is not formed in part B of the driver circuit unit, semiconductor layer 104c is typically completely covered with photoresist 120, while only a central portion of semiconductor layer 104a of the pixel region and semiconductor layer 104b in part A of the driver circuit region are covered with the photoresist 120a.

As shown in FIG. 2e, an n+ implant is performed next. As a result, regions blocked by the photoresist 120a become the channel region 112a in semiconductor layer 104a and semiconductor layer 104b. Exposed semiconductor regions 112c, however, are heavily doped n+, while semiconductor layer 104c of part B of the driver circuit region is completely shielded by the photoresist 120a, and thus remains undoped at this stage of the process.

After photoresist 120a is removed, as shown in FIG. 2f, SiO₂ or SiNx is deposited over the entire substrate 101 and patterned to form gate insulating layer 105. A metal layer, such as Al, Al alloy, or Cr, is then deposited on the gate insulating layer 105 and patterned to form gate electrodes 106a, 106b and 106c and metal layer 106d. Portions of gate insulating layer 105 not covered by the metal patterns are removed. An n− implant is next carried out using gate electrodes 106a, 106b, 106c and the metal layer 106d as a mask. This n− implant causes little change in the n-type impurity concentration of region 12c previously doped n+.

In semiconductor layer 104c of part B of the driver circuit unit, however, the n− layer 112b preferably of the positive type is formed as a result of the n− implant. Further, since the width of the gate electrode 106a of the pixel unit is narrower than that of the gate electrodes 106b and 106c, the n− ions are introduced into previously undoped portions of channel layer 112a, thereby forming an LDD structure 112b in the pixel region TFT.

Figures 2H, 2I, 2J:
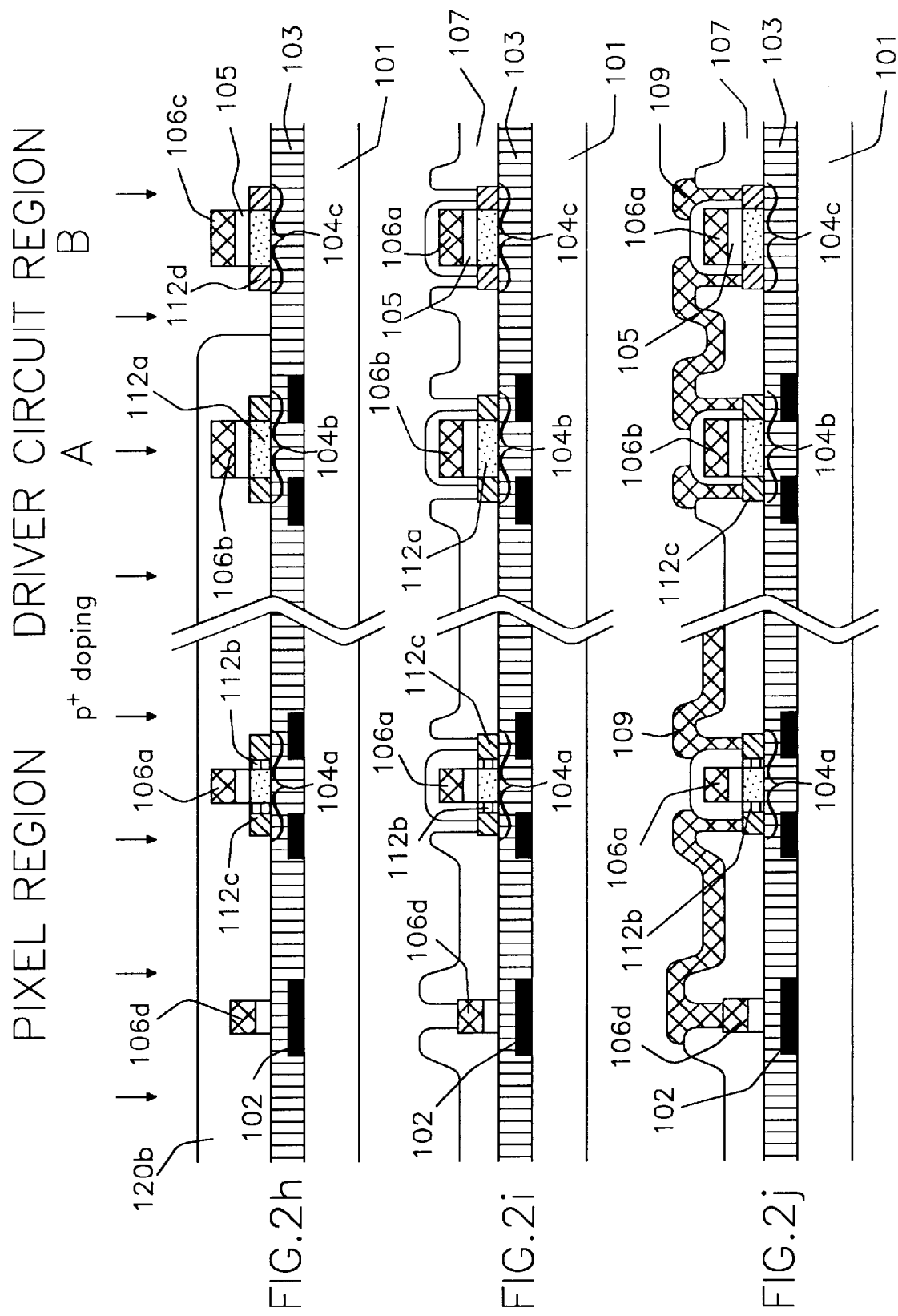

Photoresist 120b is then blanketed over the entire substrate 101 and patterned to only shield the pixel region and part A of the diver circuit region. P+ ions are then implanted into the semiconductor layer 104c. As a result, n− layer 112b in the semiconductor layer 104c is counter doped and converted into a p+ layer 112d, thereby forming PMOS TFT in addition to the NMOS TFT in region A. After the photoresist 120b is removed, as shown in FIG. 2i, an insulating layer 107, such as SiNx and SiOx, is formed over the entire surface of substrate 101 and patterned to form a contact hole. A transparent electrode 109, formed of ITO, for example, is deposited on the insulating layer 107 and into the contact hole, and patterned to form the pixel electrode and source/drain electrodes, as shown in FIG. 2j.

A liquid crystal panel, including pixel driving TFTs, CMOS TFTs for driving the pixel TFT and applying signals to the data and gate bus lines is thus are formed.

An alignment layer is then formed on the insulating layer 107 and the transparent layer 109. Since the alignment layer is formed directly on the insulating layer and not the passivation layer, no additional masks are required for providing the pad openings.

In the above mentioned process, six masks are required for patterning the black matrix, patterning the semiconductor layer, forming the gate electrode, the p+ implant mask, forming the contact hole, and forming the transparent electrode. Therefore, the number of the masks used for this process is decreased significantly relative to the conventional process described above.

In addition, the TFT for driving the pixel of the pixel unit and the CMOS TFT of the driver circuit are fabricated at the same time. Accordingly, the process is simplified, the yield is improved, and the fabrication cost is decreased. Further, since the black matrix is formed under the TFT for driving the pixel and the CMOS in one process step aperture ratio is improved.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A liquid crystal panel comprising:

a substrate including a pixel region and a driver circuit region;

a plurality of light shielding portions over the substrate in portions of the pixel region and the driver circuit region;

a buffer layer over the substrate and the plurality of light shielding portions;

complementary metal oxide semiconductor thin film transistors in the driver circuit region, the complementary metal oxide semiconductor thin film transistors including a first thin film transistor and a second thin film transistor, the first thin film transistor including first impurity regions of a first conductivity type; a channel layer, a gate insulating layer, and a gate electrode, the second thin film transistor including second impurity regions of a second conductivity type, a channel layer, a gate insulating layer, and a gate electrode;

a third transistor in the pixel region, the third transistor including third impurity regions of said first conductivity type, fourth impurity regions of said first conductivity type, a channel layer, a gate insulating layer, and a gate electrode;

an insulating layer on said pixel and drive circuit regions and having a contact hole over a portion of said pixel region; and a pixel electrode on the insulating layer and into the contact hole.

2. A liquid crystal panel according to claim 1, wherein the first conductivity type is n and the second conductivity type is p.

3. A liquid crystal panel in accordance with claim 2, wherein an impurity concentration of said third region is greater than that of said fourth regions.

4. A liquid crystal panel according to claim 1, wherein said third transistor has a lightly doped drain structure.

5. A liquid crystal panel according to claim 1, wherein the pixel electrode includes indium tin oxide.

6. A liquid crystal panel according to claim 1, wherein said insulating layer includes another contact hole over another portion of said pixel region, a source/drain electrode formed of the same material as said pixel electrode being provided in said another contact hole.

7. A liquid crystal panel according to claim 1, wherein the plurality of light shielding portions include a black matrix.

8. A liquid crystal panel comprising:

a substrate including a pixel region and a driver circuit region;

a plurality of light shielding portions over the substrate in portions of the pixel region and the driver circuit region;

a buffer layer over the substrate and the plurality of light shielding portions;

a first transistor over the buffer layer in the driver circuit region; and a second transistor over the buffer layer in the pixel region.

9. A liquid crystal panel according to claim 8, wherein the plurality of light shielding portions include a black matrix.

* * * * *

UNITED STATES PATENT AND TRADEMARK OFFICE
CERTIFICATE OF CORRECTION

PATENT NO. : 5,969,702
DATED : October 19, 1999
INVENTOR(S) : Sung-Sik BAE

It is certified that error appears in the above-identified patent and that said Letters Patent is hereby corrected as shown below:

On the Title Page, Item [57], in the Abstract, line 3, "semiconductors layer" should read --semiconductor layers--.

On the Title Page, Item [57], in the Abstract, line 8, "forming a gate electrode on the gate electrode" should read --forming a gate electrode on the gate insulating layer--.

Signed and Sealed this

Twentieth Day of June, 2000

Attest:

Q. TODD DICKINSON

*Attesting Officer*  *Director of Patents and Trademarks*